United States Patent
Ozaki et al.

(10) Patent No.: US 7,268,564 B2
(45) Date of Patent: Sep. 11, 2007

(54) APPARATUS FOR MEASURING SPECIFIC ABSORPTION RATE OF RADIO COMMUNICATION APPARATUS

(75) Inventors: Akihiro Ozaki, Neyagawa (JP); Koichi Ogawa, Hirakata (JP); Yoshio Koyanagi, Ebina (JP); Yutaka Saito, Nomi-gun (JP); Shoichi Kajiwara, Moriguchi (JP); Yoshitaka Asayama, Ogasa-gun (JP); Atsushi Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 637 days.

(21) Appl. No.: 10/784,928

(22) Filed: Feb. 25, 2004

(65) Prior Publication Data

US 2004/0232776 A1    Nov. 25, 2004

(30) Foreign Application Priority Data

Feb. 26, 2003    (JP)    ............................. 2003-048913

(51) Int. Cl.
*G01R 29/08*    (2006.01)
*H01Q 17/00*    (2006.01)

(52) U.S. Cl. ............... 324/632; 324/95; 455/115.1; 343/703

(58) Field of Classification Search ............... 324/642, 324/629, 95, 632; 343/703
See application file for complete search history.

(56) References Cited

U.S. PATENT DOCUMENTS 5,789,929 A * 8/1998 Hankui .................. 324/642
6,525,657 B1 * 2/2003 Wojcik .................. 340/514
6,587,677 B1 * 7/2003 Hombach et al. ........ 455/226.2
6,603,440 B2 * 8/2003 Howard .................. 343/866
6,919,845 B2 * 7/2005 Ozaki et al. .............. 343/703

(Continued)

FOREIGN PATENT DOCUMENTS

| EP | 0 970 988 | | 1/2000 |
|---|---|---|---|
| EP | 1281977 A | * | 2/2003 |
| JP | 2790103 | | 6/1998 |
| JP | 2000-82333 | | 3/2000 |

(Continued)

OTHER PUBLICATIONS

Lazzi, G. et al., "Experimental Study on Compact, High-Gain, Low SAR Single- and Dual-Band Patch Antenna for Cellular Telephones", 1998, IEEE, pp. 130-133.

(Continued)

*Primary Examiner*—Anjan Deb
(74) *Attorney, Agent, or Firm*—Wenderoth, Lind & Ponack, L.L.P.

(57) ABSTRACT

In an apparatus for measuring a specific absorption rate (SAR), a first near magnetic field distribution of a radio wave radiated from an array antenna of a reference antenna including a plurality of minute antennas is measured, and an SAR distribution with respect to the radio wave radiated from the array antenna is measured with a predetermined phantom. Then a distribution of a transformation coefficient α is calculated by dividing the measured SAR distribution by a square of the measured first near magnetic field distribution, a second near magnetic field distribution of a radio wave radiated from a measured radio communication apparatus is measured, and an SAR distribution with respect to the radio wave radiated from the radio communication apparatus is calculated by multiplying a square of the measured second near magnetic field distribution by the calculated distribution of the transformation coefficient α.

12 Claims, 14 Drawing Sheets

U.S. PATENT DOCUMENTS

2006/0012530 A1* 1/2006 Onishi et al. ............... 343/702
2007/0063905 A1* 3/2007 Garreau et al. ............. 343/703

FOREIGN PATENT DOCUMENTS

JP   2002-107396        4/2002
WO   WO 2004079299 A2 * 9/2004

OTHER PUBLICATIONS

Rossetto, F. et al., "FDTD Characterization of Radiation Patterns from Flexible Microstrip Applicators", 1997, IEEE, pp. 1562-1565.

N. Kuster et al., entitled "*Energy Absorption Mechanism*", by Biological Bodies in the Near Field of Dipole Antennas Above 300 MHZ, IEEE Transaction on Vehicular Technology, vol. 41, No. 1, pp. 17-23, Feb. 1992.

"*Standard of Specific Absorption Rate Measurement Method of Portable Radio Terminal*", issued by Association of Radio Industries and Business in Japan, ARIB STB-T56 Ver. 2.0, revised on Jan. 24, 2002.

Bernhard Rosenberger, entitled "*Miniature Dielectric-loaded Personal Telephone Antennas with Low SAR*", Radio and Wireless Conference, 1998, Rawcon 98, IEEE Colorado Springs, Colorado, USA, Aug. 9, 1998, pp. 103-108.

Yoshio Koyanagi et al., entitled "*Estimation of the Radiation and SAR Characteristics of the NHA at 150 MHz by Use of the Cylindroid Whole Body Phantom*", IEEE Antennas and Propagation Society International Symposium, 2001, Digest, APS, Boston, Massachusetts, USA, Jul. 8, 2001, New York, vol. 1 of 4, pp. 78-81.

* cited by examiner

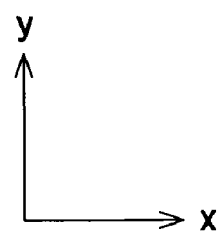
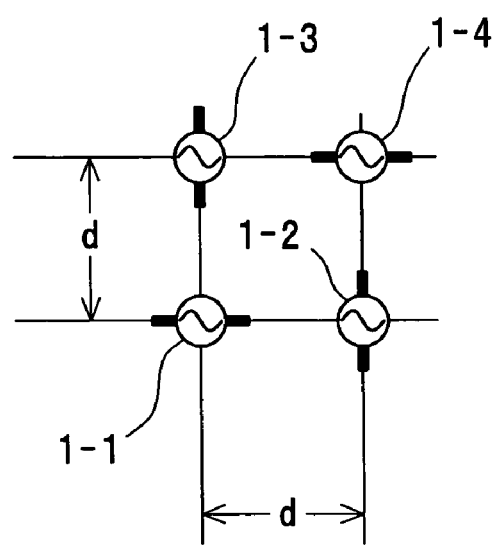

APPARATUS FOR MEASURING SPECIFIC ABSORPTION RATE OF RADIO COMMUNICATION APPARATUS

BACKGROUND OF THE INVENTION

1. Field of the Invention

The present invention relates to an apparatus for measuring a specific absorption rate (hereinafter, referred to as an "SAR"), and in particular, to an apparatus for measuring an SAR of a radio communication apparatus such as a mobile phone, a portable radio communication apparatus, or the like.

2. Description of the Related Art

Recently, portable radio communication apparatuses such as a mobile phone have spread greatly. Accompanying this, a problem regarding the influence of electromagnetic waves radiated from a portable radio communication apparatus onto a human body has been caused. As a general index of the influence, an SAR is provided. The SAR is an electric power absorbed by a unit mass by exposing a living body such as a human body or the like to an electromagnetic field, and is expressed by the following Equation (1):

$$SAR = (\sigma E^2)/\rho \qquad (1),$$

where E [V/m] is an electric field intensity, $\sigma$[S/m] is an electrical conductivity of an organic tissue, and $\rho$ [kg/m$^3$] is a density of the vital tissue.

In an SAR evaluation method or a so-called electric field detecting probe method as explained in "Method for Measuring Specific Absorption Rate of Mobile Phone or the like Used on Human Temporal Side" in Telecommunications Technology Council Report of the Ministry of Public Management, Home Affairs, Posts and Telecommunications in Japan, a human body model or so-called phantom is used that simulates a shape, a size, and electric characteristics of cephalic tissues electric characteristics. Using this phantom, an SAR which may be generated in the human body is experimentally estimated (See a first prior art document of "Standard of Specific Absorption Rate (SAR) Estimation Method for Portable Radio Terminal", ARIB STB-T56 Ver. 2.0, Revised on Jan. 24, 2002, Association of Radio Industries and Business in Japan ("ARSB")).

Legal regulations for the SAR have been enforced globally. For this reason, it is essential to conduct an SAR check in a manufacturing process of a portable radio communication apparatus such as a mobile phone or the like. To this end, a method and an apparatus capable of simply, promptly conducting the SAR check are required. There has been conventionally proposed, as a simple SAR estimation method, an estimation method for experimentally estimating the SAR based on a magnetic field intensity H on a surface of the phantom in, for example, a second prior art document of N. Kuster et al., "Energy Absorption Mechanism by Biological Bodies in the Near Field of Dipole Antenna Above 300 MHz", IEEE Transaction on Vehicular Technology, Vol. 41, No. 1, pp. 17-23, February 1992. With this conventional method, it has been confirmed that a relationship expressed by the following Equation (2) is established for the distribution of an SAR as generated on a surface of the human body:

$$SAR \propto H^2 \qquad (2).$$

There is disclosed as a conventional SAR estimation method, an SAR estimation method for calculating an electric current distribution from an incident magnetic field on the surface of the phantom when an electromagnetic wave is radiated from an antenna to obtain the SAR distribution in, for example, the Japanese Patent No. 2790103. With this conventional SAR estimation method, the magnetic field is detected by a magnetic field detecting probe that includes movement and rotation mechanisms, then the electric current distribution of the antenna is thereby estimated, and the SAR is evaluated from this electric current distribution.

In the actual measurement of the SAR, it is necessary to do so under various conditions including the arrangement of the mobile phone relative to the head of the phantom, a type of the antenna, and an arrangement state of the antenna. The maximum SAR of measurement results under the various conditions is set as an SAR of the mobile phone. For this reason, it takes a considerably long time to measure the SAR. Even if the simple SAR measuring method mentioned above is used, the arrangement of the portable radio communication apparatus with respect to the phantom should be changed. Further, in the actual SAR measurement, the SAR is measured with the mobile phone closely attached to the phantom. With the conventional method disclosed by the Japanese Patent No. 2790103, the incident magnetic field on the surface of the phantom is measured. Due to this, the magnetic field cannot be measured while the mobile phone is arranged in accordance with the actual SAR measurement. It is, therefore, disadvantageously impossible to check the SAR of the mobile phone on the production line by the conventional SAR measuring apparatus or method.

Moreover, according to the prior art, the SAR of the portable radio communication apparatus is measured while the apparatus is closely attached to the head of the human body. For this reason, an actual surface magnetic field cannot be measured, and an error is generated in the measured SAR. In addition, when the portable radio communication apparatus, an ordinary dipole antenna, or the like is employed as a reference antenna, a part having a low magnetic field intensity locally may be caused, and magnetic field detection precision is deteriorated. As a result, an SAR estimation error is disadvantageously generated.

SUMMARY OF THE INVENTION

It is an object of the present invention to provide an SAR measuring apparatus capable of solving the above-mentioned conventional disadvantages, and capable of measuring an SAR of a radio communication apparatus by a simpler method, with higher precision, with a simpler configuration, as compared with the prior art.

According to one aspect of the present invention, an apparatus for measuring a specific absorption rate (SAR) of a radio communication apparatus (referred to as a SAR measuring apparatus hereinafter) is provided. In the SAR measuring apparatus, a first measurement device measures in free space a first near magnetic field distribution of a radio wave radiated from an array antenna of a reference antenna including a plurality of minute antennas, and a second measurement device measures a specific absorption rate (SAR) distribution with respect to the radio wave radiated from the array antenna, with a predetermined phantom using a predetermined measuring method. Then, a first calculation device calculates a distribution of a transformation coefficient $\alpha$ by dividing the measured specific absorption rate (SAR) distribution by a square of the measured first near magnetic field distribution, a third measurement device measures in free space a second near magnetic field distribution of a radio wave radiated from a radio communication apparatus to be measured, and a second calculation device estimates and calculates a specific absorption rate (SAR)

distribution with respect to the radio wave radiated from the radio communication apparatus to be measured, by multiplying a square of the measured second near magnetic field distribution by the calculated distribution of the transformation coefficient α.

In the above-mentioned SAR measuring apparatus, the minute antennas are preferably minute dipole antennas.

In the above-mentioned SAR measuring apparatus, the array antenna is preferably formed by arranging a plurality of minute antennas in a one-dimensional array on a plane along a shape of a side surface of a head of a human body. Alternately, the array antenna is preferably formed by arranging a plurality of minute antennas in a two-dimensional array on a plane along a shape of a side surface of a head of a human body.

In the above-mentioned SAR measuring apparatus, the array antenna is preferably formed by arranging a plurality of minute antennas at an equal antenna interval "d".

In the above-mentioned SAR measuring apparatus, the plurality of minute antennas are preferably arranged in the array antenna so that the antenna interval "d" satisfies $d \leq 1.1 h$ when a measurement interval between the array antenna and the first measurement device is "h". Alternately, a plurality of minute antennas is preferably arranged in the array antenna so that the antenna interval "d" satisfies $d \leq 1.3 h$ when a measurement interval between the array antenna and the first measurement device is "h".

In the above-mentioned SAR measuring apparatus, the array antenna is preferably arranged so that main beams from the plurality of minute antennas are parallel to each other.

In the above-mentioned SAR measuring apparatus, the array antenna is preferably arranged so that main beams from the minute antennas adjacent to each other among the plurality of minute antennas are orthogonal to each other.

According to another aspect of the present invention, an SAR measuring apparatus is provided. In the SAR measuring apparatus, a first measurement device measures in free space a first near magnetic field distribution of a radio wave radiated from a flat-plane-shaped dipole antenna of a reference antenna, and a second measurement device measures a specific absorption rate (SAR) distribution with respect to the radio wave radiated from the flat-plane-shaped dipole antenna, with a predetermined phantom using a predetermined measuring method. Then a first calculation device calculates a distribution of a transformation coefficient α by dividing the measured specific absorption rate (SAR) distribution by a square of the measured first near magnetic field distribution, a third measurement device measures in free space a second near magnetic field distribution of a radio wave radiated from a radio communication apparatus to be measured, and a second calculation device estimates and calculates a specific absorption rate (SAR) distribution with respect to the radio wave radiated from the radio communication apparatus to be measured, by multiplying a square of the measured second near magnetic field distribution by the calculated distribution of the transformation coefficient α.

In the above-mentioned SAR measuring apparatus, the flat-plane-shaped dipole antenna preferably includes two rectangular radiation conductors having sizes different from each other to be formed so that a feeding point is excluded from a range of a near magnetic field measurement.

The above-mentioned SAR measuring apparatus preferably includes an impedance matching circuit connected with the flat-plane-shaped dipole antenna, and the impedance matching circuit makes an impedance matching between a feeding line and the flat-plane-shaped dipole antenna.

Accordingly, according to the SAR measuring apparatus and method of the present invention, the near magnetic field distribution and the SAR distribution are measured using as the reference antenna the minute array antenna including a plurality of minute antennas or a flat-plane-shaped dipole antenna, and then the magnetic field distribution in free space of the portable radio communication apparatus is measured. It is thereby possible to estimate the SAR distribution by quite a simpler method with higher precision, as compared with the prior art.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 11 is a plan view which illustrates an arrangement of an array antenna that includes four minute dipole antennas according to a second modified preferred embodiment of the present invention;

DETAILED DESCRIPTION OF THE PREFERRED EMBODIMENTS

Figure 1:
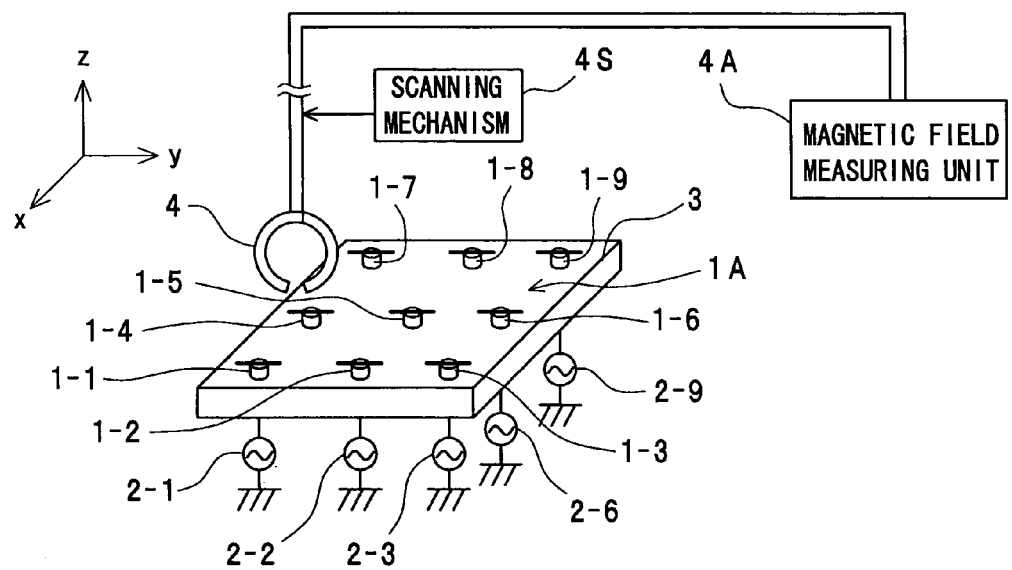
FIG. 1 is a perspective view and a block diagram which illustrates a magnetic field measuring apparatus provided in an SAR measurement system according to a first preferred embodiment of the present invention.

Preferred embodiments of the present invention will be described hereinafter with reference to the drawings. In the drawings, components similar to those in the drawings denoted by the same numerical references.

First Preferred Embodiment

Figure 2:
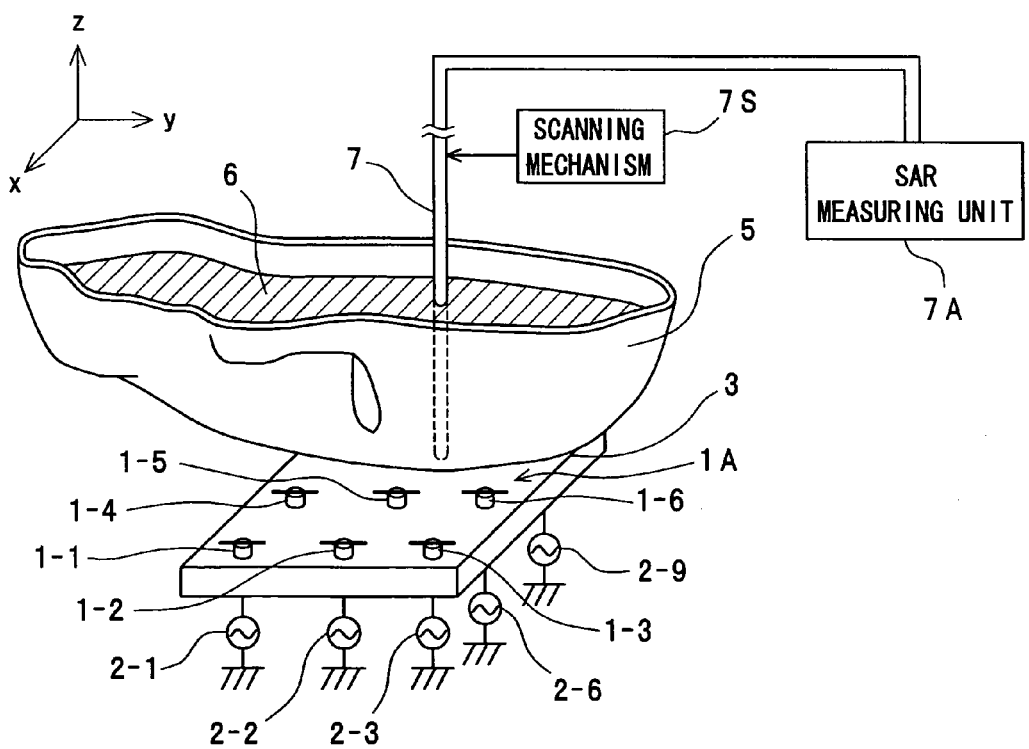
FIG. 2 is a perspective view and a block diagram which illustrate an SAR measuring apparatus provided in the SAR measurement system according to the first preferred embodiment of the present invention.
Figure 12:
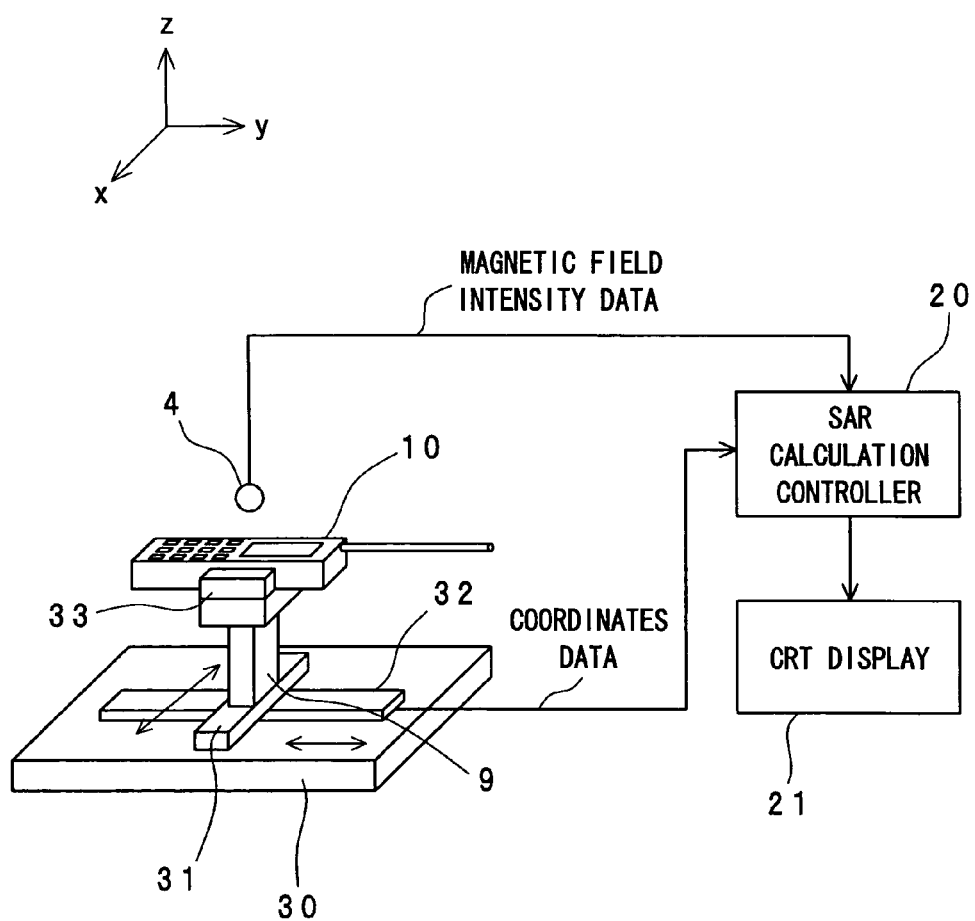
FIG. 12 is a perspective view and a block diagram which illustrate a configuration of the SAR measurement system according to the preferred embodiments of the present invention.
Figure 13:
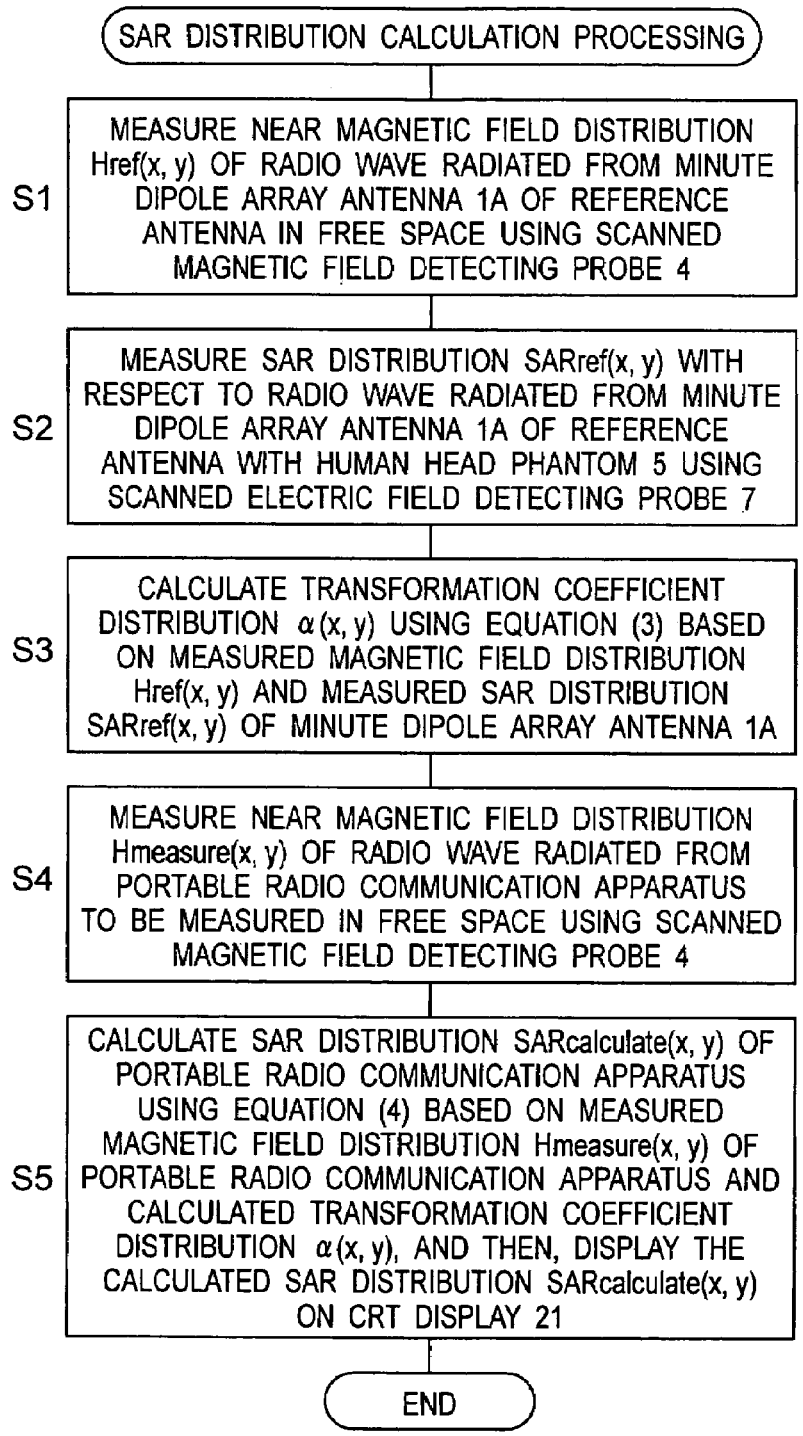
FIG. 13 is a flow chart which illustrates an SAR distribution calculation processing executed by an SAR calculation controller 20 shown in FIG. 12.

FIG. 1 is a perspective view and a block diagram which illustrate a magnetic field measuring apparatus of an SAR measurement system according to a first preferred embodiment of the present invention. FIG. 2 is a perspective view and a block diagram which illustrate an SAR measuring apparatus of the SAR measurement system according to the first preferred embodiment of the present invention. Further, FIG. 12 is a perspective view and a block diagram which illustrate a configuration of the SAR measurement system according to the preferred embodiment of the present invention. FIG. 13 is a flow chart which illustrates an SAR distribution calculation processing executed by an SAR calculation controller 20 shown in FIG. 12.

An SAR distribution calculation method according to the preferred embodiment of the present invention is characterized by executing an SAR distribution calculation processing shown in FIG. 13 using a minute dipole array antenna 1A including nine minute dipole antennas 1-1 to 1-9, and using the SAR measurement system shown in FIGS. 1, 2, and 12.

The basic principle of an SAR distribution estimation method according to the first preferred embodiment will be described first. In the first preferred embodiment, an SAR distribution is estimated in free space while paying attention to the high correlation between the SAR and the magnetic field. First of all, a magnetic field intensity distribution $H_{ref}(x, y)$ of a radio wave radiated from the reference antenna is measured, and an SAR distribution $SAR(x, y)$ with respect to the radio wave radiated from the reference antenna is measured using a predetermined phantom. Next, a coefficient determined by a ratio of a square of the measured magnetic field intensity distribution $H_{ref}$ to the measured SAR distribution $SAR_{ref}$ is calculated at each of the two-dimensional measurement points in an xy coordinate system. A distribution $\alpha(x, y)$ of a transformation coefficient $\alpha$ is calculated using the following Equation (3):

$$\alpha(x,y) = \{SAR_{ref}(x,y)\}/\{H_{ref}^2(x,y)\} \quad (3).$$

Thereafter, a magnetic field intensity distribution $H_{measure}(x, y)$ of the portable radio communication apparatus to be measured is measured in free space. An SAR distribution $SAR_{calculate}(x, y)$ of the portable radio communication apparatus to be measured can be calculated by multiplying the calculated magnetic field intensity distribution $H_{measure}(x, y)$ by the calculated distribution $\alpha(x, y)$ of the transformation coefficient $\alpha$ as expressed by the following Equation (4):

$$SAR_{calculate}(x,y) = \alpha(x,y) H_{measure}^2(x,y) \quad (4).$$

Figure 3:
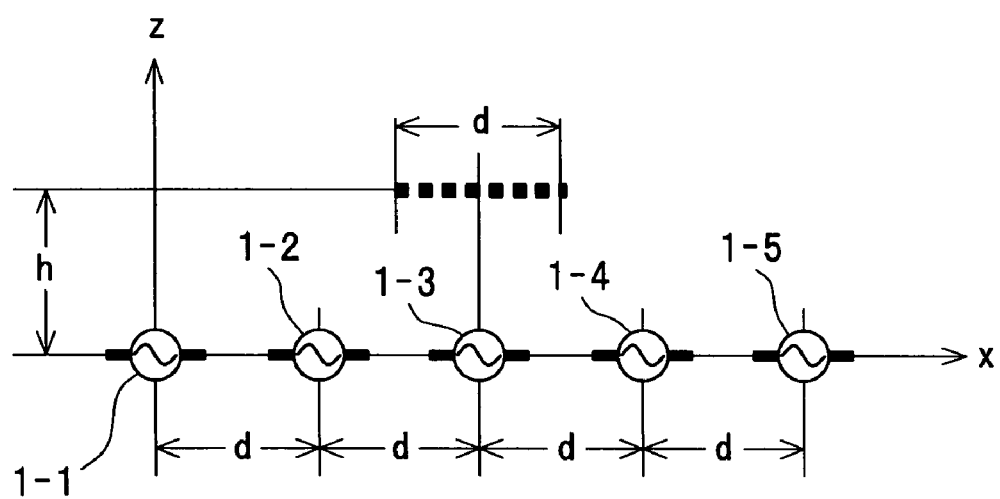
FIG. 3 is a plan view which illustrates an arrangement of a minute dipole array antenna used in the SAR measurement system according to the first preferred embodiment of the present invention.

Referring to FIG. 1, a method for measuring a near magnetic field distribution $H_{ref}(x, y)$ of the radio wave radiated from the minute dipole array antenna 1A of a reference antenna will be described next. In FIG. 1, as the reference antenna having a uniform magnetic field distribution, the minute dipole array antenna 1A is used, which is constituted by arranging the nine minute dipole antennas 1-1 to 1-9 (generically denoted by numerical reference 1) at an equal interval in two-dimensional array (on the assumption that a distance between centers of the two adjacent minute dipole antennas is "d" as shown in FIG. 3), for example. Each of the minute dipole antennas 1 preferably has a length which is equal to or larger than 0.01 wavelength and is equal to or smaller than 0.2 wavelength, more preferably a length which is equal to or larger than 0.01 wavelength and is equal to or smaller than 0.1 wavelength, and still more preferably a length which is equal to or larger than 0.02 wavelength and is equal to or smaller than 0.1 wavelength.

The respective minute dipole antennas 1-1 to 1-9 are supported by a dielectric substrate 3, and are connected with radio signal generators 2-1 to 2-9, respectively, that generate radio signals having the same frequency and the same phase as each other, where the generated radio signals are synchronized based on a reference radio signal from a single oscillator (not shown) using, for example, a PLL circuit. The radio signals generated by the radio signal generators 2-1 to 2-9 are supplied to the minute dipole antennas 1-1 to 1-9, and radio waves corresponding to the radio signals are radiated from the minute dipole antennas 1-1 to 1-9, respectively, then this leads to obtaining a substantially uniform magnetic field distribution near the minute dipole array antenna 1A. At that time, a magnetic field detecting probe 4 using, for example, a circular loop antenna is scanned in two dimensions in the x and y directions by a scanning mechanism 4S.

Then, the near magnetic field distribution $H_{ref}(x, y)$ is measured in free space using a magnetic field measuring unit 4A by means of a predetermined method which has been known to those skilled in the art (this method uses such a principle that an electric current flowing in the magnetic field detecting probe 4 is proportional to the magnetic field), based on a detection signal from the magnetic field detecting probe 4.

Referring to FIG. 2, a method for measuring the SAR distribution $SAR_{ref}(x, y)$ with respect to the radio wave radiated from the minute dipole array antenna 1A of the reference antenna will be further described. In FIG. 2, a phantom filled with an SAR liquid 6 having a predetermined composition is used as a human head phantom 5 made of, for example, a material mainly consisting of silicon resin and having a shape of a human head. An electric field detecting probe 7 is scanned in the two dimensions in the x and y directions along an inner wall surface of the human head phantom 5. The SAR distribution $SAR_{ref}(x, y)$ is measured using an SAR measuring unit 7A by means of a predetermined method which has been known to those skilled in the art (this method uses such a principle that a voltage induced by the magnetic field detecting probe 4 is proportional to the electric field and that a square of the electric field is proportional to the SAR as expressed by the Equation (1)) based on a detection signal from the electric field detecting probe 7. As the SAR liquid 6, a liquid is used that, for example, consists of 56.5% of sucrose, 40.92% of deionized water, 1.48% of sodium chloride, 1.0% of hydroxyl cellulose, and 0.1% of germicide at the frequency "f" of 900 MHz. In addition, at the frequency "f" of 1900 MHz, a liquid is used that, for example, consists of 44.92% of butyl Carbitol, 54.90% of deionized water, and 0.18% of sodium chloride. In the present specification, the percentage of the composition means volume percentage.

In the first preferred embodiment, the nine minute dipole antennas 1-1 to 1-9 are arranged as one example in a two-dimensional array of three by three. However, the present invention is not limited to this, and a plurality of minute dipole antennas may be arranged in either a one-dimensional array or a two-dimensional array.

FIG. 3 is a plan view which illustrates an arrangement of the minute dipole array antenna used in the SAR measurement system according to the first preferred embodiment of the present invention. The arrangement of the minute dipole antennas 1 for forming a uniform magnetic field distribution, a substantially uniform magnetic field distribution, or a magnetic field distribution near the uniform distribution will now be described. In the present preferred embodiment, an instance of arranging the five minute dipole antennas 1-1 to 1-5 at the equal interval "d" on the x axis, as shown in FIG. 3, will be described. This is intended to consider an influence of the minute dipole antenna 1 arranged outward of the adjacent minute dipole antenna 1. In addition, in order to make the magnetic field distribution more uniform, the minute dipole antennas 1-1 to 1-5 are arranged at the equal interval "d". Besides, the minute dipole antennas 1-1 to 1-5 are arranged so that longitudinal directions of the antennas 1-1 to 1-5 are parallel to the x direction.

Now, a difference will be described between the maximum and minimum magnetic field intensities in a section (shown at an upper part of FIG. 3) having the interval "d" about a coordinate position of the minute dipole antenna 1-3 located at the center of the section which is calculated by means of an analysis method which has been known to those skilled in the art, and a result of the calculation. The purpose of the analysis is to determine the interval "d" for forming the substantially uniform magnetic field distribution. The analysis is performed while setting a measurement interval "h" (that is the measurement interval between each minute dipole antenna 1 and the magnetic field detecting probe 4) at 2 [mm], 3 [mm], and 5 [mm]. The frequency of radio wave used in the analysis is 900 MHz. It is noted that radio waves of the radio signals having the same frequency and the same phase are radiated from the respective minute dipole antennas 1-1 to 1-5. In addition, a length L of each minute dipole antenna 1 is set to 1 [mm].

Figure 6:
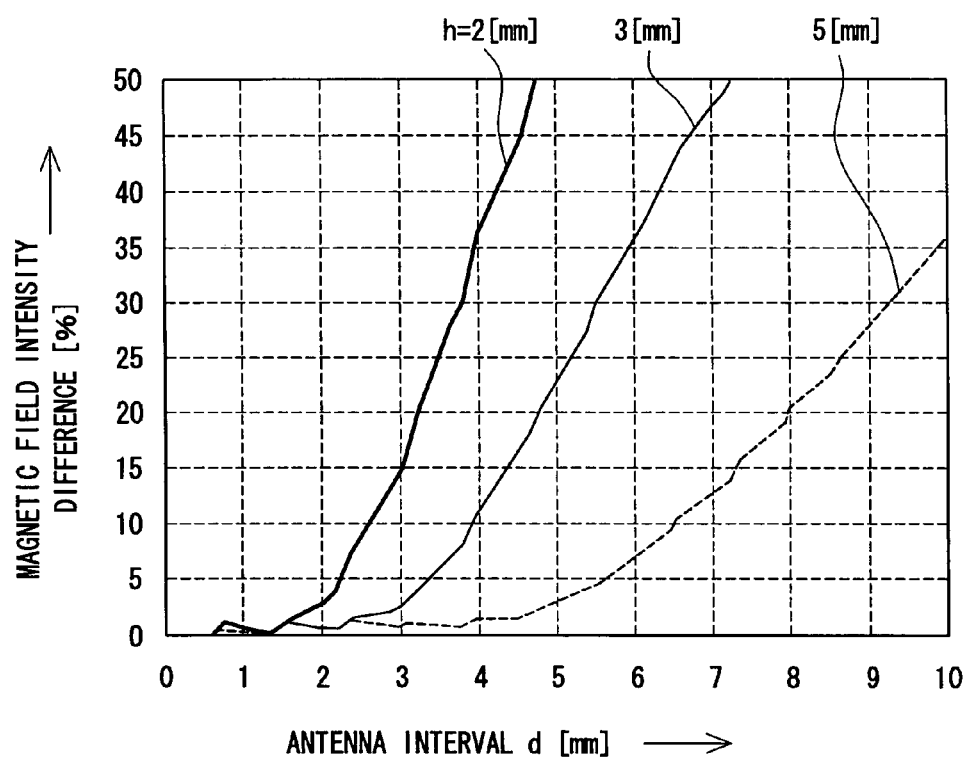
FIG. 6 is a graph which illustrates analysis results when the minute dipole array antenna shown in FIG. 3 is used, and which illustrates a difference between maximum and minimum magnetic field intensities in a measurement width "d" with a center of a coordinate position of a minute dipole antenna 1-3 for the antenna interval "d" with the measurement interval "h" set as a parameter.

FIG. 6 is a graph which illustrates analysis results when the minute dipole array antenna shown in FIG. 3 is used, and which illustrates a difference between the maximum and minimum magnetic field intensities with a measurement width "d" with a center of a coordinate position of the minute dipole antenna 1-3 for the antenna interval "d" with the measurement interval "h" set as a parameter. In FIG. 6, the vertical axis is a difference between the maximum and minimum magnetic field intensities (referred to as a magnetic field intensity difference hereinafter) in the measurement width "d" with a center of a coordinate position of the minute dipole antenna 1-3 located at the center. The magnetic field intensity difference is indicated by a percentage with respect to an average in the measurement width "d" of the interval. Namely, the antenna interval "d" is set to be equal to the measurement width "d".

As is apparent from FIG. 6, at the measurement interval h=2 [mm], the measurement width "d" is 2.6 [mm] and the difference between the maximum and minimum magnetic field intensities is about 10[%]. In addition, at the measurement width d=2.2 [mm], the difference between the maximum and minimum magnetic field intensities is equal to or smaller than 5[%]. Therefore, the magnetic field intensity distribution obtained from the analysis result can be considered to be sufficiently uniform. Furthermore, at the measurement interval h=3 [mm], the measurement width "d" satisfies a relationship of d≦3.3 [mm] and the magnetic field difference is within 5[%]. At the measurement interval h=5 [mm], the measurement width "d" satisfies a relationship of d≦5.5 [mm] and the magnetic field difference is within 5[%]. It can be seen from this that the measurement width "d" should be set to satisfy a relationship of d≦1.1 h with respect to the measurement interval "h" in order to fall the magnetic field intensity difference within 5[%]. Further, it can be seen that the measurement width "d" should be set to 1.3 times or less of the measurement interval "h" in order to fall the magnetic field intensity difference within 10[%].

Next, the relationship among the measurement width "d" (=the antenna interval "d"), the measurement interval "h" from the respective minute dipole antennas 1-1 to 1-5, and a wavelength λ of the used radio wave will be described as follows. As is apparent from the analysis results shown in FIG. 6, the relationship between the measurement width "d" and the measurement interval "h" satisfies the following Equations (5) and (6):

$$d \leq 1.3 \, h \text{ for an error within } 10\%; \text{ and} \quad (5)$$
$$d \leq 1.1 \, h \text{ for an error within } 5\%. \quad (6)$$

In this case, it is necessary for the relationship between the measurement width "d" and the wavelength λ to satisfy the following Equation (7) under conditions according to the sampling theorem:

$$d \leq \lambda/2 \qquad (7).$$

From the Equation (5) or (6) and the Equation (7), the maximum value of the measurement width "d" is determined. However, the maximum value of the measurement interval "h" cannot be determined from the Equation (5) or (6) and the Equation (7) but determined from a received electric power of the probe as follows.

Figure 4:
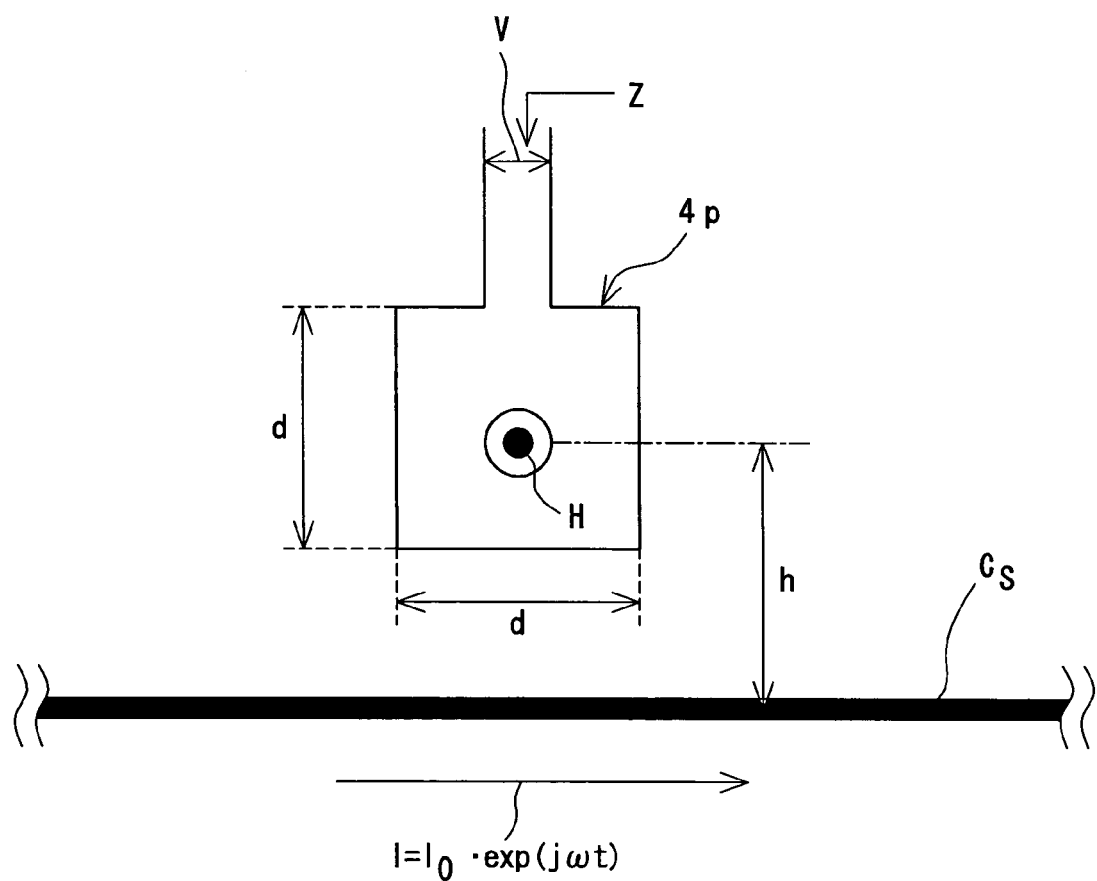
FIG. 4 is a front view showing a relationship among a length "d" of a side of a loop, a height "h" of a magnetic field H, and a wavelength λ, when a minute square loop probe $4p$ is used as a magnetic field detecting probe 4 shown in FIG. 1.

An instance of using a minute square loop probe 4b of FIG. 4 will be described. FIG. 4 is a front view for illustrating a relationship among a length "d" of a side of a loop, a height "h" of a magnetic field H, and the wavelength λ when the minute square loop probe 4p is used as the magnetic field detecting probe 4 shown in FIG. 1. In this example, the maximum value of the loop probe 4p is a scanning interval of the magnetic field detecting probe 4. As the size of the magnetic field detecting probe 4 is larger, the sensitivity of the probe 4 becomes higher but the resolution of the probe 4 becomes lower. For this reason, the resolution of the magnetic field detecting probe 4 needs to be at least the resolution capable of resolving the scanning interval. The magnetic field H at the center of the probe when an electric current $I=I_0 \cdot \exp(j\omega t)$ flows in a line conductor Cs having an infinite length that is an antenna element for generating the electromagnetic field (where a radio wave angular frequency $\omega=2\pi f$, where "f" is the radio wave frequency) is expressed by the following Equation (8) according to the Ampere's rule:

$$H = I/(2\pi h) \qquad (8).$$

The magnetic flux density B is expressed by the following Equation (9):

$$B = \mu_0 \cdot H \qquad (9).$$

In the Equation (9), $\mu_0$ is a magnetic permeability in vacuum. Further, according to the Faraday's law of electromagnetic induction, an electromotive voltage V of an electromotive force is expressed by the following Equation (10):

$$V = -(d\Phi/dt) \qquad (10).$$

In the Equation (10), Φ is a magnetic flux, which is expressed by the following Equation (11) assuming that an area S is d×d (the maximum of the measurement width "d"):

$$\begin{aligned}\Phi &= B \cdot S \\ &= \mu_0 \cdot H \cdot d^2 \\ &= \mu_0 \cdot I/(2\pi h) \cdot d^2.\end{aligned} \qquad (11)$$

Accordingly, the electromotive voltage V is expressed by the following Equation (12):

$$V = -\mu_0/(2\pi h) \cdot d^2 (dI/dt) \qquad (12).$$

Since the following Equation (13) is satisfied, the following Equation (14) is obtained:

$$(dI/dt) = j\omega I \qquad (13); \text{ and}$$

$$V = -j\omega \cdot \mu_0 \cdot I/(2\pi h) \cdot d^2 \qquad (14).$$

When the input impedance of the probe is Z, the received electric power Pr is expressed by the following Equation (15):

$$\begin{aligned}Pr &= V^2/Z \\ &= (\omega \cdot \mu_0 \cdot I_0 \cdot d^2/(2\pi h))^2/Z.\end{aligned} \qquad (15)$$

Since the following Equation (16) is satisfied, the following Equation (17) is obtained:

$$\omega = 2\pi/\lambda \qquad (16); \text{ and}$$

$$Pr = (\mu_0 \cdot I_0 \cdot d^2/(h \cdot \lambda))^2/Z \qquad (17).$$

When the received electric power Pr is equal to or larger than the thermal noise No received by a radio receiver ($N_0 = k_B \cdot B \cdot T$, where $k_B$ is the Boltzmann's constant, B is the bandwidth [Hz] of the radio receiver, and T is the absolute temperature [K]), the received electric power Pr can be detected. That is, the maximum value of the measurement interval "h" can be determined by the following Equations (18) and (19):

$$Pr \leq N_0 \qquad (18); \text{ and}$$

$$(\mu_0 \cdot I_0 \cdot d^2/(h \cdot \lambda))^2/Z > k_B \cdot B \cdot T \qquad (19).$$

Therefore, the following Equation (20) can be obtained:

$$h < \mu_0 \cdot I_0 d^2/(\lambda \cdot (k_B \cdot B \cdot T \cdot Z)^{1/2}) \qquad (20).$$

Figure 5:
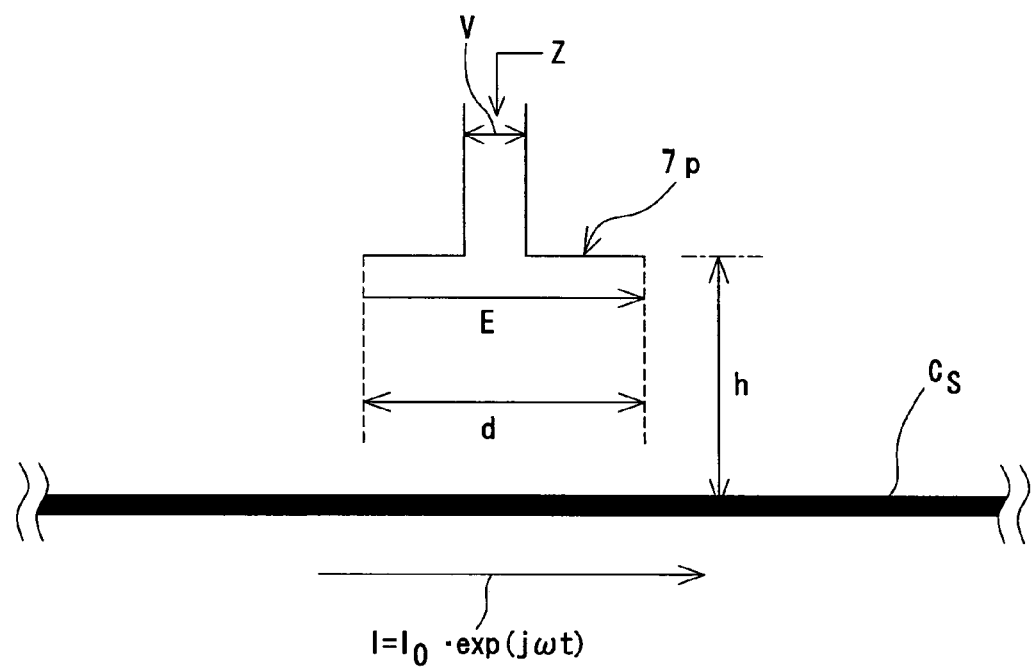
FIG. 5 is a front view showing a relationship among the length "d" of the minute dipole probe, the height "h" of the magnetic field H, and the wavelength λ, when a minute dipole probe $7p$ is used as the magnetic field detecting probe 4 shown in FIG. 1.

Similarly, when the minute dipole probe 7p is used, the maximum value of the measurement interval "h" can be determined based on the received electric power Pr as follows. FIG. 5 is a front view showing a relationship among the length "d" of the minute dipole probe, the height "h" of the magnetic field H, and the wavelength λ, when the minute dipole probe 7p is used as the magnetic field detecting probe 4 shown in FIG. 1. In this example, the maximum length of the minute dipole is the scanning interval of the magnetic field detecting probe 4. As the size of the magnetic field detecting probe 4 is larger, the sensitivity of the probe 4 becomes higher but the resolution of the probe 4 is lower. For this reason, it is necessary for the resolution of the magnetic field detecting probe 4 to be at least the resolution capable of resolving the scanning interval. When an electric field of the minute dipole probe apart by a distance of the measurement interval "h" from the electric current I is E, the electromotive voltage V of the electromotive force is expressed by the following Equation (21):

$$V = E \cdot d \qquad (21).$$

When the ratio of the electric field E to the magnetic field H is η, the electric field E is expressed by the following Equation (22):

$$E = \eta \cdot H \qquad (22).$$

At that time, the electric field E is expressed by the following Equation (23):

$$E = \eta \cdot I/(2\pi h) \qquad (23).$$

Therefore, the electromotive voltage V and the received electric power Pr are expressed by the following Equations (24) and (25), respectively:

$$V = E \cdot d = (\eta \cdot I \cdot d)/(2\pi h) \qquad (24); \text{ and}$$

$$Pr = V^2/Z = ((\eta \cdot I \cdot d)/(2\pi h))^2/Z \qquad (25).$$

When the received electric power Pr is equal to or larger than the thermal noise $N_0(=k_B \cdot B \cdot T)$ received by the radio receiver, the received electric power Pr can be detected. Namely, the following Equations (26) and (27) are obtained:

$$Pr > N_0 \qquad (26); \text{ and}$$

$$(\eta \cdot I_0 \cdot d/(2\pi h))^2/Z > k_B \cdot B \cdot T \qquad (27).$$

Thus, the maximum value of the measurement interval "h" is determined and the following Equation (28) is obtained:

$$h < \eta \cdot I_0 \cdot d/(2\pi \cdot (k_B \cdot B \cdot T \cdot Z)^{1/2}) \qquad (28).$$

In the preferred embodiment, the instance of approximately calculating conditions from the electric current flowing in the line conductor Cs having the infinite length has been described. When it is assumed that the characteristic impedance of the line conductor Cs having the infinite length is $Z_0$, an input electric power $P_{in}$ of the line conductor Cs is expressed by the following Equation (29). In the Equation (29), an amplitude $I_0$ of an electric current flowing in each of the minute dipole antennas 1-1 to 1-9 is equivalently expressed as the amplitude $I_0$ of an electric current flowing in the line conductor Cs:

$$P_{in} = Z_0 \cdot I_0^2 \qquad (29).$$

Accordingly, the following Equation (30) is obtained:

$$I_0 = (P_{in}/Z_0)^{1/2} \qquad (30).$$

The Equation (30) may be assigned to the above-mentioned conditional Equation (Equation (5) or (6)). Normally, at high frequency or radio frequency, the electric power and the impedance are often known, for example, the input electric power of the antenna is 10 dBm and the impedance is 50Ω.

Figure 7:
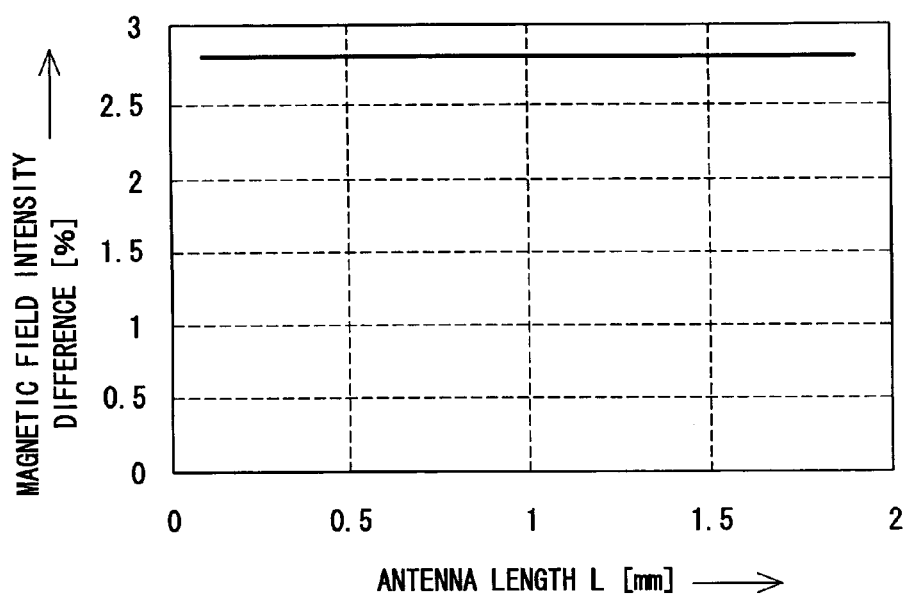
FIG. 7 is a graph which illustrates analysis results when the minute dipole array antenna shown in FIG. 3 is used, and which illustrates a magnetic field intensity difference with respect to an antenna length L.

FIG. 7 is a graph which illustrates analysis results when the minute dipole array antenna shown in FIG. 3 is used, and which illustrates the magnetic field intensity difference with respect to the antenna length L. In FIG. 7, the antenna interval "d" of the minute dipole antennas 1 is 2 [mm] and the measurement interval "h" is 2 [mm], and further, the length L is changed from 0.1 to 1.9 [mm]. As is apparent from FIG. 7, even if the length L is changed, the difference between the maximum and minimum magnetic field intensities is hardly changed and the intensity differences at L=0.1 [mm] and L=1.9 [mm] are both equal to or smaller than 0.1[%]. The antenna length L of the minute dipole antenna 1 is not limited to a specific value but may be such that the adjacent antennas do not contact with each other.

Figure 8:
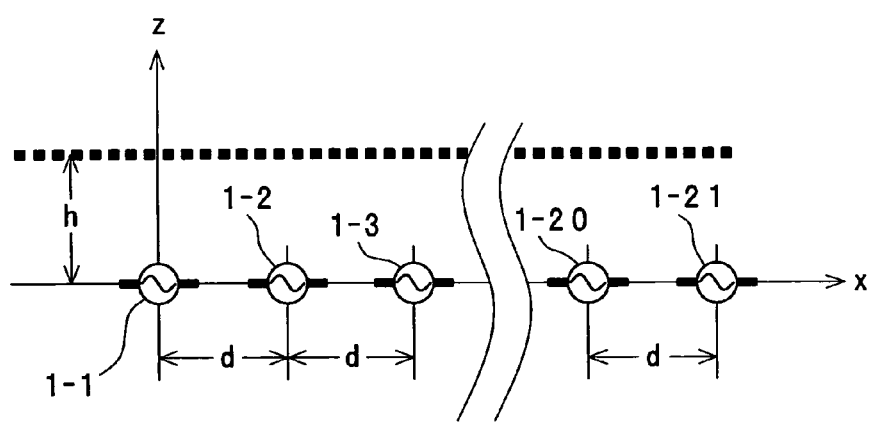
FIG. 8 is a plan view which illustrates an arrangement of the array antenna that includes 21 minute dipole antennas.

FIG. 8 is a plan view which illustrates an arrangement of the array antenna that includes 21 minute dipole antennas 1-1 to 1-21. As the confirm of the above-mentioned conditions, the magnetic field distribution of a model having the 21 minute dipole antennas 1-1 to 1-21 arranged and having the antenna interval d=5 [mm] was analyzed as shown in FIG. 8. In this case, the length L of each of the minute dipole antennas 1-1 to 1-21 is set to 1 [mm] and the measurement interval "h" is set to 5 [mm].

Figure 9:
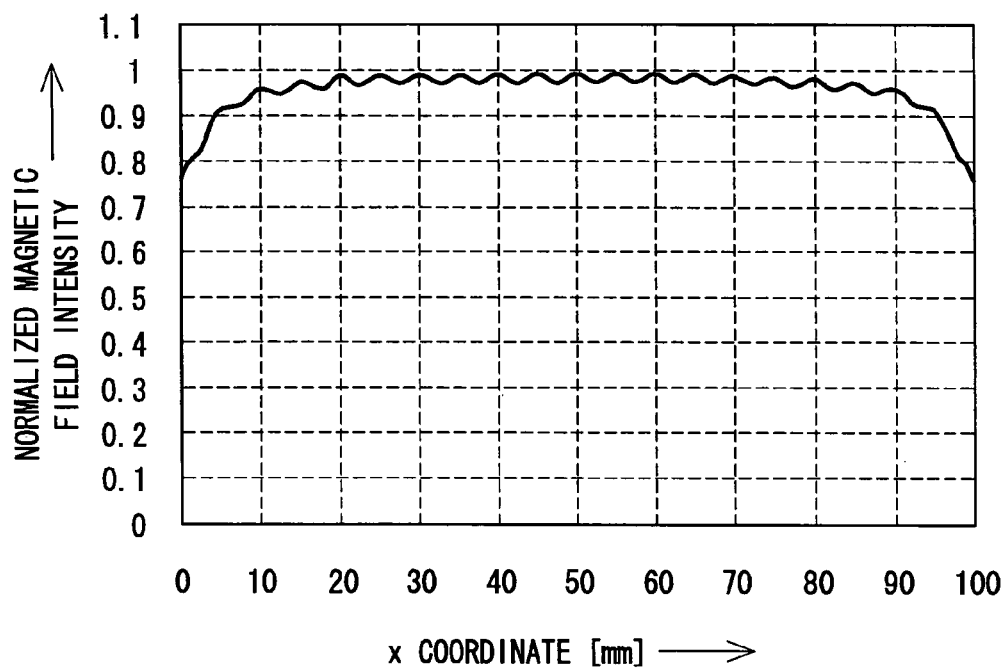
FIG. 9 is a graph which illustrates analysis results when the array antenna shown in FIG. 8 is used, and which illustrates a normalized magnetic field intensity normalized to the maximum magnetic field intensity with respect to the x coordinate.

FIG. 9 is a graph which illustrates analysis results when the array antenna shown in FIG. 8 is used, and which illustrates a normalized magnetic field intensity normalized to the maximum magnetic field intensity with respect to the x coordinate. As is apparent from FIG. 9, the magnetic field intensity difference for the maximum magnetic intensity is within 10[%] in a range of 5 [mm]≦x≦95 [mm], and within 5[%] in a range of 10 [mm]≦x≦90 [mm]. It can be seen from this that the substantially uniform magnetic field distribution can be obtained in a wider range.

In the first preferred embodiment mentioned above, by arranging the minute dipole antennas 1 at the antenna interval "d" in the two-dimensions, it is possible to generate the uniform magnetic field distribution in the two-dimensions. In the first preferred embodiment shown in FIGS. 1, 2 and the like, the directions of the minute dipole antennas 1 are all set to one direction in parallel to each other.

Figure 10:
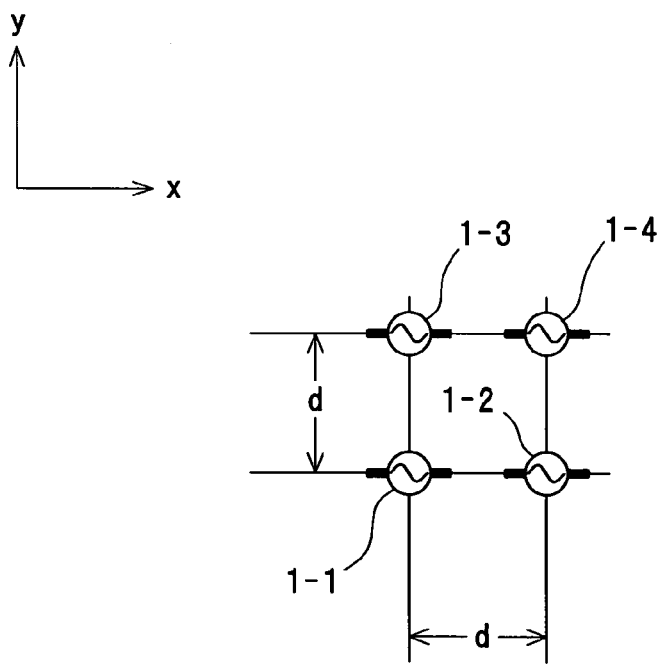
FIG. 10 is a plan view which illustrates an arrangement of an array antenna that includes four minute dipole antennas according to a first modified preferred embodiment of the present invention.

FIG. 10 is a plan view which illustrates an array antenna that includes four minute dipole antennas according to a first modified preferred embodiment of the present invention. In FIG. 10, longitudinal directions of the respective minute dipole antennas 1 are parallel to each other, and the main beams from the respective minute dipole antennas 1 are parallel to each other, as well. In the first modified preferred embodiment, since the magnetic field intensity decreases on end portions of the array antenna, it is necessary to set the range of arranging the respective minute dipole antennas 1 to be slightly larger than at least the range of arranging the portable radio communication apparatus used for the measurement.

FIG. 11 is a plan view which illustrates an arrangement of an array antenna that includes four minute dipole antennas according to a second modified preferred embodiment of the present invention. In contrast to the configuration shown in FIG. 10, the minute dipole antennas 1 may be arranged so that the adjacent minute dipole antennas 1 are orthogonal to each other as shown in FIG. 11 in order to maintain isolation of the adjacent minute dipole antennas 1 from each other. In the second modified preferred embodiment, the main beams from the minute dipole antennas 1 are parallel to each other. It is thereby possible to generate a uniform magnetic field containing two components orthogonal to each other.

FIG. 12 is a perspective view and a block diagram which illustrate a configuration of an SAR measurement system according to a preferred embodiment of the present invention. Referring to FIG. 12, an x stage 31 movable in the x direction and a y stage 32 movable in the y direction are provided on a support base 30, a rectangular support column 9 extending vertically from the stages 31 and 32 is provided, and a fixed support section 33 is provided on an upper end portion of the support column 9. A portable radio communication apparatus 10 to be measured is sandwiched by the fixed support section 33 so as to be fixedly supported by the fixed support section 33. When the x stage 31 moves, the portable radio communication apparatus 10 can be moved in the x direction. When the y stage 32 moves, the portable radio communication apparatus 10 can be moved in the y direction. It is thereby possible to move the portable radio communication apparatus 10 in the x and y directions, i.e., in the two dimensions, relative to the fixed magnetic field detecting probe 4. In the present preferred embodiment, the coordinates data from the x stage 31 and the y stage 32 are inputted to the SAR calculation controller 20, and magnetic field intensity data detected by the magnetic field detecting probe 4 is inputted to the SAR calculation controller 20.

An SAR distribution measuring method using the SAR measurement system shown in FIG. 12 will be described with reference to a flow chart of an SAR distribution calculation processing shown in FIG. 13.

In step S1 of FIG. 13, the minute dipole array antenna 1A of a reference antenna is excited by the radio signals having the same frequency and the same phase as each other, thereby radiating a radio wave from the minute dipole array antenna 1A. The near magnetic field distribution $H_{ref}(x, y)$ of the radiated radio wave is measured in free space using the magnetic field scanning probe 4 which is apart from the minute dipole array antenna 1A by a certain distance and which is scanned in the x and y directions, i.e., in the two-dimensions. In step S2, the minute dipole array antenna 1A is excited in a manner similar to that of step S1, thereby radiating the radio wave from the minute dipole array antenna 1A. The SAR distribution $SAR_{ref}(x, y)$ with respect to the radio wave is measured with the human head phantom 5 using the electric field detecting probe 7 which is scanned in the x and y directions, i.e., in the two-dimensions along the inner wall surface of the phantom 5.

In step S3, the transformation coefficient distribution $\alpha(x, y)$ is calculated using the Equation (3) based on the measured magnetic field distribution $H_{ref}(x, y)$ and the measured $SAR_{ref}(x, y)$ of the minute dipole array antenna 1A. In step S4, the portable radio communication apparatus to be measured is excited, thereby radiating the radio wave from the portable radio communication apparatus. The near magnetic field distribution $H_{measure}(x, y)$ of the radiated radio wave is measured in free space using the magnetic field detecting probe 4 which is scanned in the x and y directions, i.e., in the two-dimensions. Finally, in step S5, the SAR distribution $SAR_{calculate}(x, y)$ of the portable radio communication apparatus is calculated using the Equation (4) based on the magnetic field distribution $H_{measure}(x, y)$ measured in step S5 and the transformation coefficient $\alpha(x, y)$ calculated in step S3, and then the calculated SAR distribution $SAR_{calculate}(x, y)$ is displayed on a CRT display 21.

In the Equation (3), a denominator is the square of the magnetic field distribution $H_{ref}(x, y)$. Due to this, when the value of the magnetic field distribution $H_{ref}(x, y)$ is smaller, the measurement error of the SAR distribution $SAR_{ref}(x, y)$ is larger. Accordingly, the error may be possibly caused in the SAR distribution $SAR_{calculate}(x, y)$ calculated using the Equation (4). Nevertheless, by using the minute dipole array antenna 1A arranged to obtain the uniform or substantially uniform magnetic field distribution, the transformation coefficient $\alpha(x, y)$ can be calculated, and the measurement precision upon measuring the SAR distribution of the portable radio communication apparatus can be improved, as compared with the prior art.

Furthermore, when the range of the arrangement of the minute dipole array antenna 1A is set in a range in which the antenna 1A covers the side surface of the head, it is possible to apply the present invention to various types of portable radio communication apparatuses. For example, folding portable radio communication apparatuses include an apparatus having the antenna arranged on a top surface of a housing and an apparatus having an antenna arranged on a folding hinge section. Generally speaking, the magnetic field intensity is the highest near the feeding point, so that the SAR is larger near the feeding point, as well. Therefore, when the position of antenna changes, the magnitude of the magnetic field and the SAR greatly change depending on the configuration of the portable radio communication apparatus. With the method according to the present preferred embodiment, since the antenna (or the array antenna) having the substantially uniform magnetic field distribution over the surface of the human head is used as the reference antenna, it is possible to deal with the difference in the configuration of the portable radio communication apparatus.

In the present preferred embodiment, the scanning mechanisms 4S and 7S are provided in the magnetic field detecting probe 4 and the electric field detecting probe 7, respectively. However, the present invention is not limited to this, and a scanning and moving mechanism for moving the dielectric substrate 3 in the two-dimensions in the x and y directions may be provided.

Figure 14:
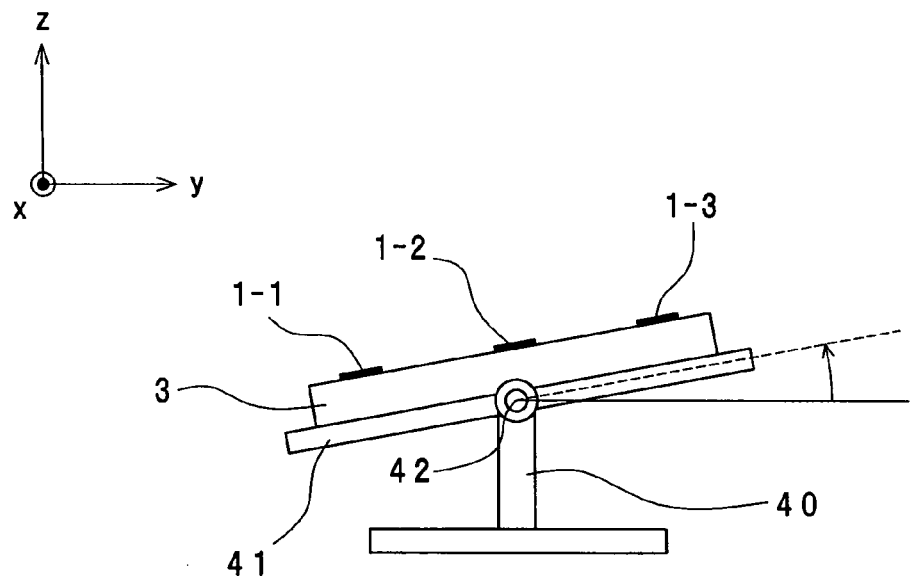
FIG. 14 is a side view which illustrates an apparatus including a support base 40 that includes an inclination mechanism 42 for inclining a dielectric substrate 3 which supports and fixes the minute dipole array antenna, according to a third modified preferred embodiment of the present invention.

FIG. 14 is a side view which illustrates an apparatus including a support base 40 that includes an inclination mechanism 42 for inclining the dielectric substrate 3 supporting and fixing the minute dipole array antenna according to a third modified preferred embodiment of the present invention. The SAR distribution measurement is conducted while changing conditions. For example, the SAR distribution is measured while the portable radio communication apparatus is fixedly attached to a cheek of the human head phantom 5 or while a sound hole section of the portable radio communication apparatus is made closer to the ear of the phantom 5.

When the conditions are thus changed, the inclined angle (i.e., the inclined angle relative to the x-y plane of FIG. 2) of the portable radio communication apparatus relative to the side surface of the human head phantom 5 changes. Therefore, as shown in FIG. 14, the inclination mechanism 42 may be provided in addition to the scanning mechanisms 4S and 7S or the scanning and moving mechanism so as to be able to set the inclined angle. Referring to FIG. 14, a support base 41 including the inclination mechanism 42 capable of inclining with respect to a horizontal plane around a predetermined rotational axis is provided on the support base 40, and the dielectric substrate 3 on which the minute dipole array antenna 1A is provided is mounted on the support base 41.

Figure 15:
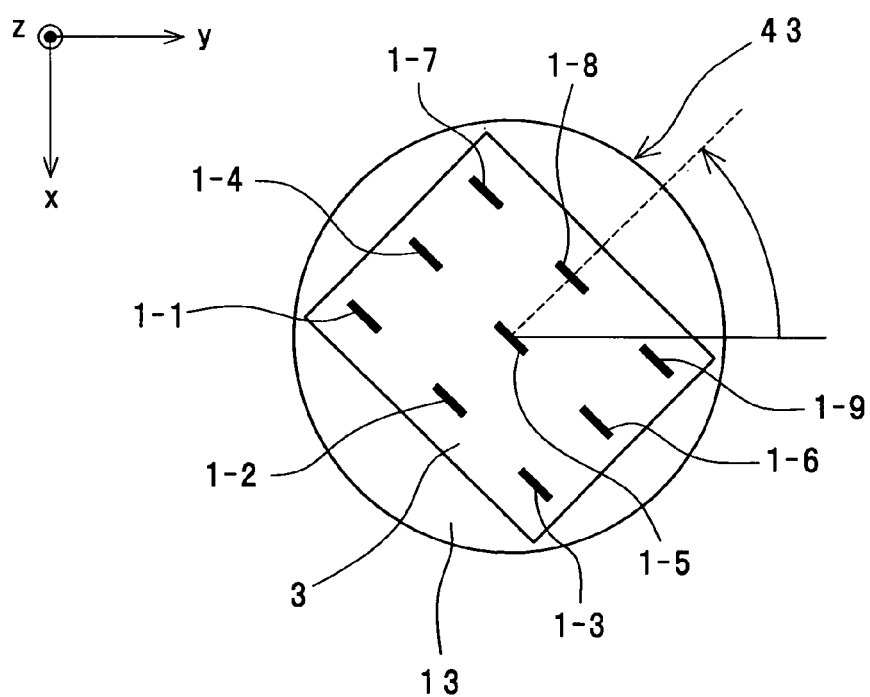
FIG. 15 is a side view which illustrates an apparatus including a support base that includes a rotating mechanism 43 for inclining the dielectric substrate 3 which supports and fixes the minute dipole array antenna, according to a fourth modified preferred embodiment of the present invention.

FIG. 15 is a side view which illustrates an apparatus including a support base that includes a rotating mechanism 43 for inclining the dielectric substrate 3 supporting and fixing the minute dipole array antenna 1A according to a fourth modified preferred embodiment of the present invention. Upon the SAR distribution measurement, the portable radio communication apparatus is disposed along a line that connects an ear and a mouth of the human head phantom 5. Therefore, as shown in FIG. 15, the rotating mechanism 43 may be provided in addition to the scanning mechanisms 4S and 7S or the scanning and moving mechanism so as to be able to finely adjust the measurement coordinate during the SAR distribution measurement. Referring to FIG. 15, the rotating mechanism 43 is provided on a support base, not shown, and the rotating mechanism 43 can rotate the minute dipole array antenna 1A around the z axis.

Figure 16:
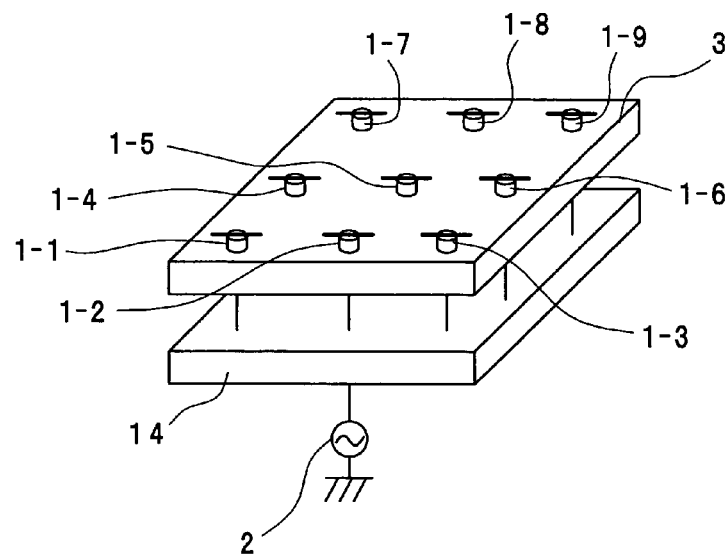
FIG. 16 is a perspective view which illustrates an arrangement of an apparatus for distributing a radio signal from the radio signal generator 2 to the respective minute dipole antennas 1-1 to 1-9 of the minute dipole array antenna using a distributor 14 according to a fifth modified preferred embodiment of the present invention.

FIG. 16 is a perspective view which illustrates an arrangement of an apparatus for distributing or dividing a radio signal from the radio signal generator 2 to the respective minute dipole antennas 1-1 to 1-9 of the minute dipole array antenna 1A using a distributor 14, according to a fifth modified preferred embodiment of the present invention. In the first preferred embodiment shown in FIGS. 1 and 2, the radio signal generators 2-1 to 2-9 are connected with the respective minute dipole antennas 1-1 to 1-9, respectively. However, the present invention is not limited to this. As shown in FIG. 16, the radio signal generated by one radio signal generator 2 may be distributed or divided into a plurality of radio signals having the same phase by the distributor 14, and then, the radio signals divided to have the equal phase may be supplied to the respective minute dipole antennas 1-1 to 1-9, respectively.

Figure 17:
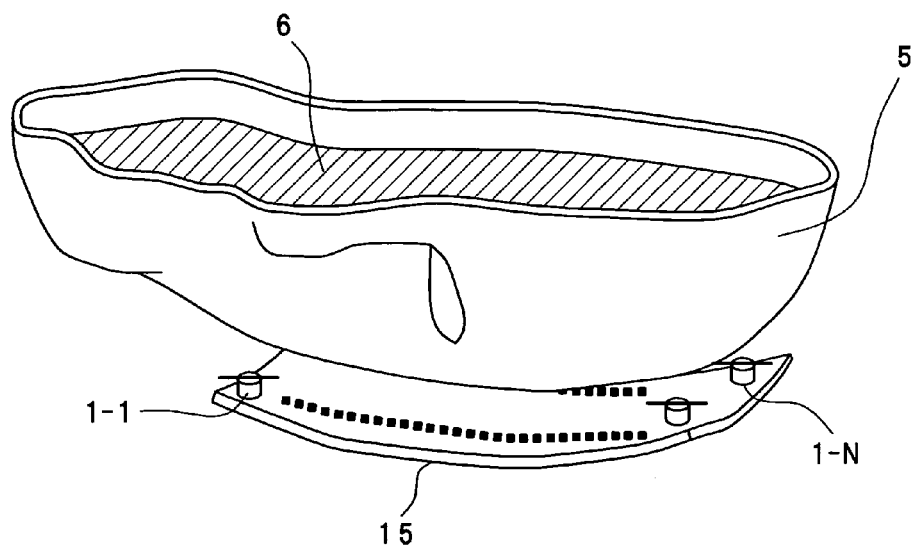
FIG. 17 is a perspective view which illustrates a configuration of an apparatus using a dielectric substrate 15 having a shape along a surface profile of a head of a human according to a sixth modified preferred embodiment of the present invention.

FIG. 17 is a perspective view which illustrates a configuration of an apparatus using a dielectric substrate 15 that has a shape along a surface profile of the human head according to the sixth modified preferred embodiment of the present invention. In the first preferred embodiment shown in FIGS. 1 and 2, the minute dipole antennas 1-1 to 1-9 are mounted on the flat-plane-shaped parallel dielectric substrate 3. However, the present invention is not limited to this. As shown in FIG. 17, the minute dipole antennas 1-1 to 1-N may be mounted on the dielectric substrate 15 having the shape along the surface profile of the human head. Referring to FIG. 17, the dielectric substrate 15 has such a size as to cover a part of the side surface of the head. However, the size of the substrate 15 is not limited to the size shown in FIG. 17, but the substrate 15 may have such as size as to cover the entire head. In the embodiment of FIG. 17, the minute dipole antennas 1-1 to 1-N are arranged in the two dimensions. Alternatively, the minute dipole antennas 1-1 to 1-N may be arranged in one-dimension.

The dielectric substrate 3 or 15 is made of a dielectric such as resin or wood. When the dielectric substrate 3 or 15 is made of resin, the resin may be polytetrafluoroethylene resin or acrylic resin. By doing so, it is possible to decrease the influence of the dielectric substrate 3 or 15 on the electromagnetic field generated by the minute dipole antennas 1, and to measure the magnetic field and the SAR with higher precision.

Second Preferred Embodiment

Figure 18:
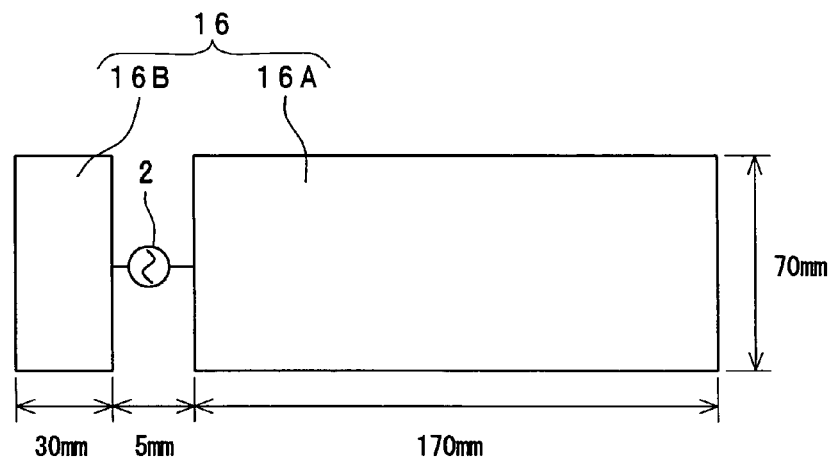
FIG. 18 is a plan view which illustrates a flat-plane-shaped dipole antenna apparatus 16 according to a second preferred embodiment of the present invention.
Figure 19:
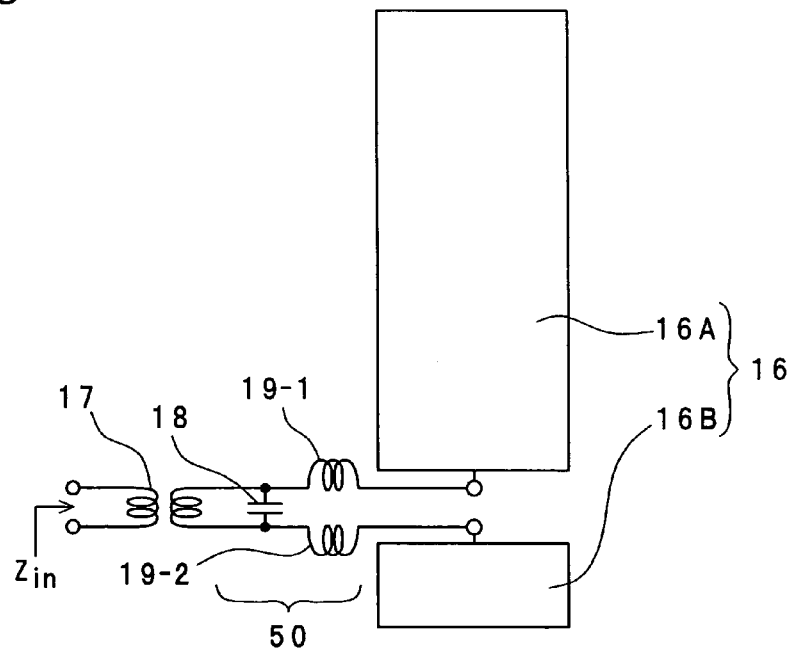
FIG. 19 is a circuit diagram which illustrates a feeder circuit for feeding electric power to the flat-plane-shaped dipole antenna apparatus 16 shown in FIG. 18.

FIG. 18 is a plan view which illustrates a flat-plane-shaped dipole antenna apparatus 16 according to a second preferred embodiment of the present invention. FIG. 19 is a circuit diagram which illustrates a feeder circuit for feeding electric power to the flat-plane-shaped dipole antenna apparatus 16 shown in FIG. 18. The second preferred embodiment is characterized by measuring the SAR distribution using the flat-plane-shaped dipole antenna apparatus 16 instead of the minute dipole array antenna 1A according to the first preferred embodiment.

The flat-plane-shaped dipole antenna apparatus 16 is made of, for example, a copper plate having a thickness of 0.5 mm. In a manner similar to that of the first preferred embodiment, the second preferred embodiment is intended to be able to form a uniform magnetic field distribution or a substantially magnetic field distribution within a measurement range of the portable radio communication apparatus. In order to widen the range of the uniform or substantially uniform magnetic field distribution, the size of the flat-plane-shaped dipole antenna apparatus 16 is set to be larger than the size of an ordinary portable radio communication apparatus (a length of about 180 mm and a width of about 50 mm), i.e., the flat-plane-shaped dipole antenna apparatus 16 has a length of 200 mm and a width of 70 mm. In addition, based on the point of view of a great change in magnetic field intensity near the feeding point of the antenna, the antenna is formed laterally asymmetric, and the antenna includes two rectangular radiation conductors 16A and 16B. Concretely, the flat-plane-shaped dipole antenna apparatus 16 includes the first rectangular radiation conductor 16A having a length of 170 mm and a width of 70 mm, and the second rectangular radiation conductor 16B having a length of 30 mm and a width of 70 mm. The apparatus 16 is disposed at a position at which a feeding point (from the radio signal generator 2) does not fall within the actual SAR measurement range (i.e., the measurement range of the near magnetic field).

The antenna apparatus 16 has a shape of a flat plane, and is laterally asymmetric. Due to this, impedance mismatching may be caused between a feeding line and the antenna apparatus 16. In order to prevent the impedance mismatching, therefore, an impedance matching circuit 50 including a balancer 17 having a ratio of the number-of-turns of 1:4, a capacitor 18, and inductors 19-1 and 19-2 is inserted in front of the flat-plane-shaped dipole antenna apparatus 16. According to a prototype produced by the inventors of the present invention, when the impedance matching circuit 50 is designed so as to make impedance matching at a frequency of 900 MHz, the capacitance of the capacitor 18 is set to 2.5 [pF] and the inductances of the inductors 19-1 and 19-2 are both set to 10 [nH].

Figure 20:
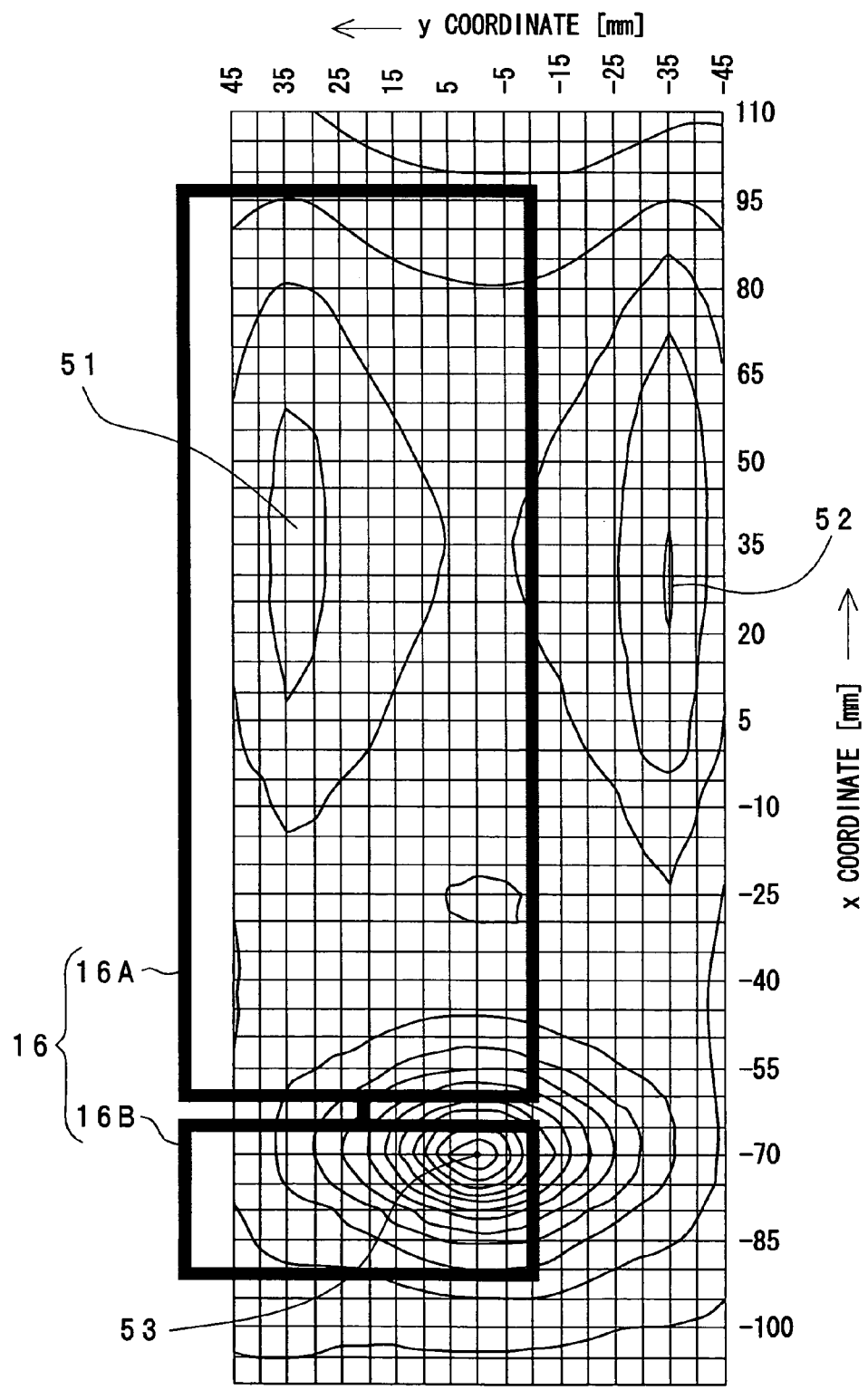
FIG. 20 is a graph which illustrates a near magnetic field distribution of the flat-plane-shaped dipole antenna apparatus 16 shown in FIG. 18.

FIG. 20 is a graph which illustrates a near magnetic field distribution of the flat-plane-shaped dipole antenna apparatus 16 shown in FIG. 18. Referring to FIG. 20, the near magnetic field distribution is shown at the frequency of 900 MHz, and contour lines of the magnetic field intensity are drawn at intervals of 50 [mA/m] in a range of 0 to 700 [mA/m]. The measurement of the near magnetic field distribution is conducted at the measurement interval "h" of 6 [mm] from the surface of the antenna, and the input electric power is set to 20 [dBm].

As is apparent from FIG. 20, the magnetic field intensity difference is about 50 to 100 [mA/m] in the ranges of −50 [mm]≦x≦90 [mm] and −25 [mm]≦y≦25 [mm]. The near magnetic field distribution is substantially uniform. The maximum magnetic field intensity at (x, y)=(35, 30) of FIG. 20 is 214.98 [mA/m], that at (x, y)=(30, −35) is 254.46 [mA/m], and that at (x, y)=(−70, 0) is 665 [mA/m]. The width of the ordinary portable radio communication apparatus is about 50 [mm], and falls within the range of −25 [mm]≦y≦25 [mm]. The magnetic field intensity near the feed point is quite high in the x direction. However, this area is out of the SAR measurement range, it is not considered to generate any error due to this high magnetic field intensity.

An SAR measuring method using the antenna apparatus 16 according to the second preferred embodiment can be conducted in a manner similar to that of the first preferred embodiment. Even if this antenna apparatus 16 is used, a part having a low magnetic field distribution can not be caused. It is, therefore, possible to estimate or measure the SAR distribution with higher precision.

Alternatively, a support base that supports a lower portion of the flat-plane-shaped dipole antenna apparatus 16 may be provided. The support base may be made of resin or wood. When the support base is made of resin, polytetrafluoroethylene resin or acrylic resin may be used. In this case, it is possible to decrease the influence of the dielectric substrate 3 or 15 on the electromagnetic field generated by the minute dipole antennas 1, and to measure the magnetic field and the SAR with higher precision.

In the above-mentioned preferred embodiments, the minute dipole antennas are employed. However, the present invention is not limited to this. The other minute antennas such as minute loop antennas or minute slot antennas may be employed.

As mentioned above, according to the SAR measuring apparatus and method of the present invention, the near magnetic field distribution and the SAR distribution are measured using as the reference antenna, the minute array antenna including a plurality of minute antennas or the flat-plane-shaped dipole antenna, and then, the magnetic field distribution of the portable radio communication apparatus is measured in free space. It is thereby possible to estimate or measure the SAR distribution by a quite simpler method with higher precision, as compared with the prior art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus for measuring a specific absorption rate (SAR) of a radio communication apparatus, comprising:
a first measurement device for measuring in free space a first near magnetic field distribution of a radio wave radiated from an array antenna of a reference antenna including a plurality of minute antennas;
a second measurement device for measuring a specific absorption rate (SAR) distribution with respect to the radio wave radiated from said array antenna, with a predetermined phantom using a predetermined measuring method;
a first calculation device for calculating a distribution of a transformation coefficient α by dividing said measured specific absorption rate (SAR) distribution by a square of said measured first near magnetic field distribution;
a third measurement device for measuring in free space a second near magnetic field distribution of a radio wave radiated from a radio communication apparatus to be measured; and
a second calculation device for estimating and calculating a specific absorption rate (SAR) distribution with respect to the radio wave radiated from said radio communication apparatus to be measured, by multiplying a square of said measured second near magnetic field distribution by said calculated distribution of the transformation coefficient α.

2. The apparatus as claimed in claim 1,
wherein said minute antennas are minute dipole antennas.

3. The apparatus as claimed in claim 1,
wherein said array antenna is formed by arranging a plurality of minute antennas in a one-dimensional array on a plane along a shape of a side surface of a head of a human body.

4. The apparatus as claimed in claim 1,
wherein said array antenna is formed by arranging a plurality of minute antennas in a two-dimensional array on a plane along a shape of a side surface of a head of a human body.

5. The apparatus as claimed in claim 1,
wherein said array antenna is formed by arranging a plurality of minute antennas at an equal antenna interval "d".

6. The apparatus as claimed in claim 5,
wherein the plurality of minute antennas are arranged in said array antenna so that the antenna interval "d" satisfies $d \leq 1.1 h$ when a measurement interval between said array antenna and said first measurement device is "h".

7. The apparatus as claimed in claim 5,
wherein the plurality of minute antennas are arranged in said array antenna so that the antenna interval "d" satisfies $d \leq 1.3 h$ when a measurement interval between said array antenna and said first measurement device is "h".

8. The apparatus as claimed in claim 1,
wherein said array antenna is arranged so that main beams from the plurality of minute antennas are parallel to each other.

9. The apparatus as claimed in claim 1,
wherein said array antenna is arranged so that main beams from the minute antennas adjacent to each other among the plurality of minute antennas are orthogonal to each other.

10. An apparatus for measuring a specific absorption rate (SAR) of a radio communication apparatus, comprising:
a first measurement device for measuring in free space a first near magnetic field distribution of a radio wave radiated from a flat-plane-shaped dipole antenna of a reference antenna;
a second measurement device for measuring a specific absorption rate (SAR) distribution with respect to the radio wave radiated from said flat-plane-shaped dipole antenna, with a predetermined phantom using a predetermined measuring method;
a first calculation device for calculating a distribution of a transformation coefficient α by dividing said measured specific absorption rate (SAR) distribution by a square of said measured first near magnetic field distribution;
a third measurement device for measuring in free space a second near magnetic field distribution of a radio wave radiated from a radio communication apparatus to be measured; and
a second calculation device for estimating and calculating a specific absorption rate (SAR) distribution with respect to the radio wave radiated from said radio communication apparatus to be measured, by multiplying a square of said measured second near magnetic field distribution by said calculated distribution of the transformation coefficient α.

11. The apparatus as claimed in claim 10,
wherein said flat-plane-shaped dipole antenna comprises two rectangular radiation conductors having sizes different from each other to be formed so that a feeding point is excluded from a range of a near magnetic field measurement.

12. The apparatus as claimed in claim 11, further comprising an impedance matching circuit connected with said flat-plane-shaped dipole antenna, said impedance matching circuit making an impedance matching between a feeding line and the flat-plane-shaped dipole antenna.

* * * * *

UNITED STATES PATENT AND TRADEMARK OFFICE
CERTIFICATE OF CORRECTION

PATENT NO. : 7,268,564 B2 Page 1 of 1
APPLICATION NO. : 10/784928
DATED : September 11, 2007
INVENTOR(S) : Akihiro Ozaki et al.

It is certified that error appears in the above-identified patent and that said Letters Patent is hereby corrected as shown below:

ON THE TITLE PAGE

On the cover page, left column, item (*) Notice, please insert the following:

--This patent is subject to a terminal disclaimer.--

Signed and Sealed this

Fifteenth Day of April, 2008

JON W. DUDAS
*Director of the United States Patent and Trademark Office*